US007068087B2

(12) United States Patent
Stoops et al.

(10) Patent No.: US 7,068,087 B2
(45) Date of Patent: Jun. 27, 2006

(54) METHOD AND APPARATUS FOR AN IMPROVED TIMER CIRCUIT AND PULSE WIDTH DETECTION

(75) Inventors: John F. Stoops, Portland, OR (US); Steven K. Sullivan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 38 days.

(21) Appl. No.: 10/786,514

(22) Filed: Feb. 24, 2004

(65) Prior Publication Data
US 2005/0184777 A1   Aug. 25, 2005

(51) Int. Cl.
    *H03K 3/017*   (2006.01)
(52) U.S. Cl. .................................... 327/172; 327/265
(58) Field of Classification Search ................ 327/172, 327/176, 178, 18, 26, 31, 265, 261, 276, 327/279, 291, 298, 299
See application file for complete search history.

(56) References Cited

U.S. PATENT DOCUMENTS

| | | |
|---|---|---|
| 3,611,159 A | 10/1971 | Florsheim, Jr. |
| 3,619,669 A | 11/1971 | Wheeler |
| 3,633,113 A | 1/1972 | Grubel |
| 4,017,843 A | 4/1977 | Yanagishima |
| 4,107,553 A | 8/1978 | Carter |
| 4,212,201 A | 7/1980 | Hirsch et al. |
| 4,260,912 A | 4/1981 | Bjorke |
| 4,296,318 A | 10/1981 | Mezzetti et al. |
| 4,438,404 A | 3/1984 | Philipp |
| RE31,551 E | 4/1984 | Bjorke |
| 4,495,519 A | 1/1985 | Wahlquist |
| 4,581,585 A | 4/1986 | Bristol |
| 4,613,950 A | 9/1986 | Knierim et al. |
| 4,647,862 A * | 3/1987 | Blair ........................ 327/74 |
| 4,745,310 A | 5/1988 | Swapp |

(Continued)

FOREIGN PATENT DOCUMENTS

EP   0150325   9/1989

(Continued)

OTHER PUBLICATIONS

Meas. Sci. Technol. 1 (1990), IOP Publishing Ltd., pp. 720-724, "A New Pulse Generator For Pulsed ESR", D. Lovy, J.B. Pluss, H. Bill.

*Primary Examiner*—Timothy P. Callahan
*Assistant Examiner*—Cassandra Cox
(74) *Attorney, Agent, or Firm*—Thomas F. Lenihan

(57) ABSTRACT

A method and apparatus for an improved timer circuit and improved pulse width detection includes initiating a ramp timer and setting a timer latch output level substantially simultaneously in response to the occurrence of an input signal. The occurrence of the input signal also causes a counter to be enabled to count clock cycles. The ramp timer signal of the ramp timer is frozen (i.e., paused) by a timer control circuit, upon the occurrence of a first clock cycle following the enabling of the counter. The counter then counts a predetermined number of clock cycles after the ramp timer signal is frozen and, upon the occurrence of a last one of a predetermined number of clock cycles, generates a terminal count signal. Upon receiving the terminal count signal, the timer control circuit unfreezes ramp timer signal. The ramp timer runs until completion at which time the ramp timer generates an end of ramp control signal. The control signal is communicated to timer latch to reset timer latch output level.

26 Claims, 7 Drawing Sheets

U.S. PATENT DOCUMENTS

| | | |
|---|---|---|
| 4,809,221 A | 2/1989 | Magliocco et al. |
| 4,843,255 A * | 6/1989 | Stuebing ............... 327/230 |
| 4,868,430 A | 9/1989 | Stewart |
| 4,968,907 A | 11/1990 | Pepper |
| 5,124,597 A * | 6/1992 | Stuebing et al. ........... 327/261 |
| 5,233,232 A * | 8/1993 | Stuebing et al. ........... 327/176 |
| 6,449,570 B1 * | 9/2002 | Wilstrup et al. ............ 702/69 |
| 6,452,425 B1 * | 9/2002 | Gregorian et al. ........... 327/99 |

FOREIGN PATENT DOCUMENTS

| | | |
|---|---|---|
| JP | 4-196813 | 7/1992 |

* cited by examiner

METHOD AND APPARATUS FOR AN IMPROVED TIMER CIRCUIT AND PULSE WIDTH DETECTION

FIELD OF THE INVENTION

The invention relates generally to signal analysis instruments and, more specifically, to a method and apparatus for an improved timer circuit that may be used, for example, in resolving the width of signal pulses over a large range of time intervals.

BACKGROUND OF THE INVENTION

In a conventional real time oscilloscope, a trigger circuit detects a trigger event of an input signal and enables a display device such as a cathode-ray tube (CRT) to display a waveform of the signal during a time interval around the trigger event. It is known to produce a trigger circuit responsive to any one of several types of anomalous events, including narrow or wide pulses, or glitches. As such, pulse width detectors/generators need to operate over a large range of time intervals. Typically, large time intervals are best-resolved using counter-timer circuits including a digital counter. Digital counters provide a time resolution equal to the desired time interval within plus or minus one half of a clock cycle.

Counter-timer circuits including a digital counter, however, are not appropriate for very short time intervals of time since the desired resolution would necessitate a very short counter period and therefore an extremely high clock frequency. The shorter time intervals are best addressed using an analog system having, for example, a ramp generator in conjunction with a comparator.

An example of a system that combines the benefits of a ramp timer and a counter is known from U.S. Pat. No. 5,124,597 issued Jun. 23, 1992 to Stuebing, et al. entitled "Timer circuit including an analog ramp generator and a CMOS counter", which is incorporated herein by reference in its entirety. In the Stuebing et al. patent, a timer circuit providing a wide range of time intervals includes a ramp generator and comparator circuit. The timer circuit receives an input signal to start a ramp signal, and produces an End of Ramp output signal when the ramp reaches a predetermined amplitude. A counter circuit is responsive to the End of Ramp signal to begin counting, and produces a terminal count output signal indicating that a preselected time interval has expired. The End of Ramp signal and the terminal count signal are combined in an AND gate to provide a signal that is delayed by a predetermined amount from the input signal.

The apparatus of Steubing, et al. is useful for determining the duration of an input pulse, for example, in pulse width triggering applications. In such applications one may trigger on a pulse width shorter than a given duration, or on a pulse width longer than a given duration. While the apparatus of Stuebing, et al. works well for its intended purpose, it has been found that its circuit is able to resolve the width of the input pulse only to within one clock period, because the input signal is asynchronous to Counter's clock.

SUMMARY OF THE INVENTION

In an embodiment of the present invention, a ramp timer is initiated and a timer latch output level is set, substantially simultaneously, in response to the occurrence of an input signal. Thereafter, upon the occurrence of a predetermined edge of a clock signal, the ramp signal of the ramp timer is "frozen" (i.e., paused at its current level) and Counter begins counting clock cycles. Upon the occurrence of a terminal count signal, the ramp signal is "unfrozen" and ramping is resumed from the point at which it was paused. When the ramp reaches a predetermined amplitude, an End of Ramp signal is generated. The timer latch output level is reset upon the occurrence of the End of the Ramp signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
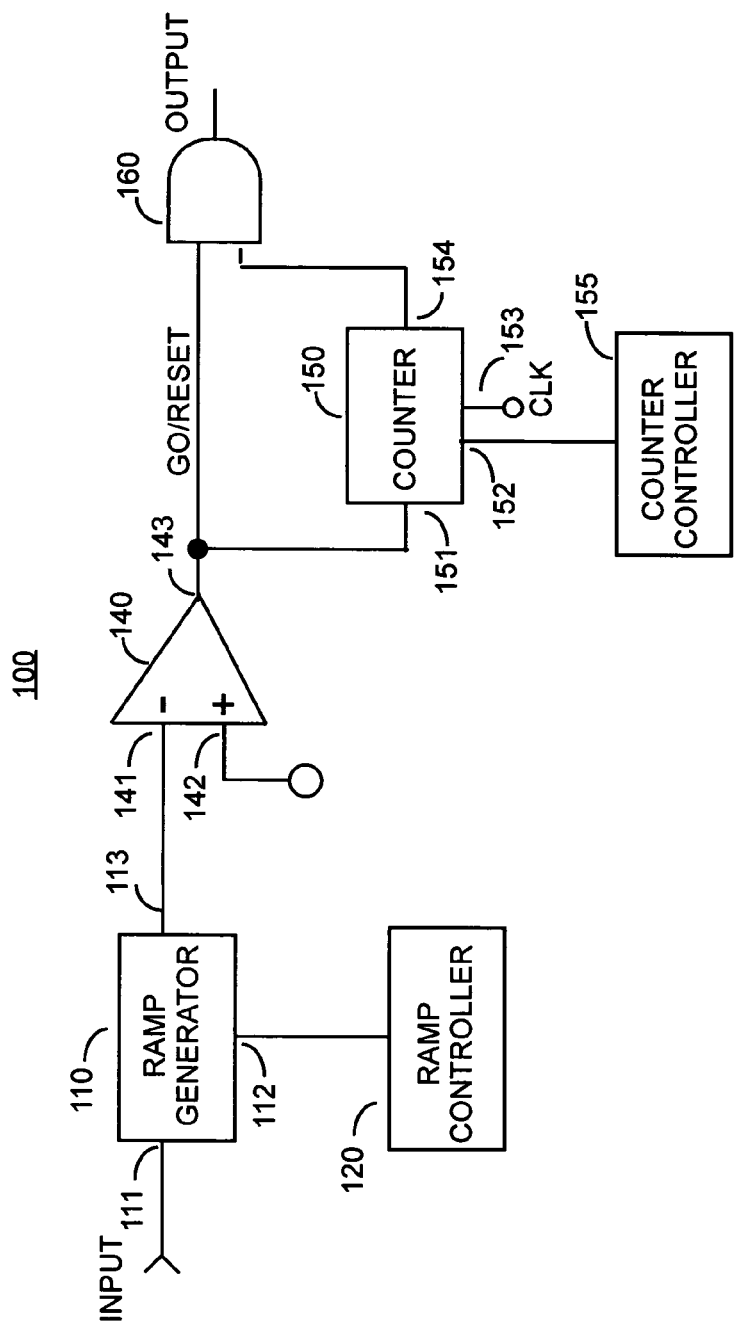
FIG. 1 depicts a high-level block diagram of a prior art timer circuit.

FIG. 1 is a simplified illustration of a high-level block diagram of a prior art timer circuit according to Stuebing, et al. Timer Circuit 100 of FIG. 1, includes a Ramp Generator circuit 110 having a first input 111 for receiving an input signal to start a ramp signal, a second input 112 for receiving a ramp timing control signal from a Ramp Controller 120, and having an output 113 for providing a ramp signal. A Comparator 140 has a first input 141 coupled to the output of the ramp generator 110, a second input 142 coupled to a reference voltage source, and an output 143 for providing an End of Ramp signal. A Counter circuit 150 has a first input 151 for receiving the End of Ramp signal to begin counting, a second input 152 for receiving a counter timing control signal from a counter controller 155, a clock input terminal 153 for receiving a clock signal, and an output 154 for providing a Terminal Count signal that is delayed from the input signal by a predetermined amount.

In practice, the predetermined amount of delay is entered by a user by selecting, for example, Trigger on Pulsewidth Greater than XX, where XX represents a time value such as 100 nsec, 10 μsec, 1 msec, etc. The End of Ramp signal and the Terminal Count signal are combined in an AND gate 160 to provide a signal that is delayed by the predetermined amount from the input signal if the input signal is still present when the terminal count signal occurs. That is, an output signal will be produced by timer circuit 100 if the input signal has a duration greater than the predetermined time delay.

As noted above, the apparatus of Stuebing et al. is able to resolve the width of an input pulse only to within one clock period. This is due to the fact that the input signal is asynchronous with respect to the clock of counter 150. This phenomenon is illustrated in FIG. 2.

Figure 2:
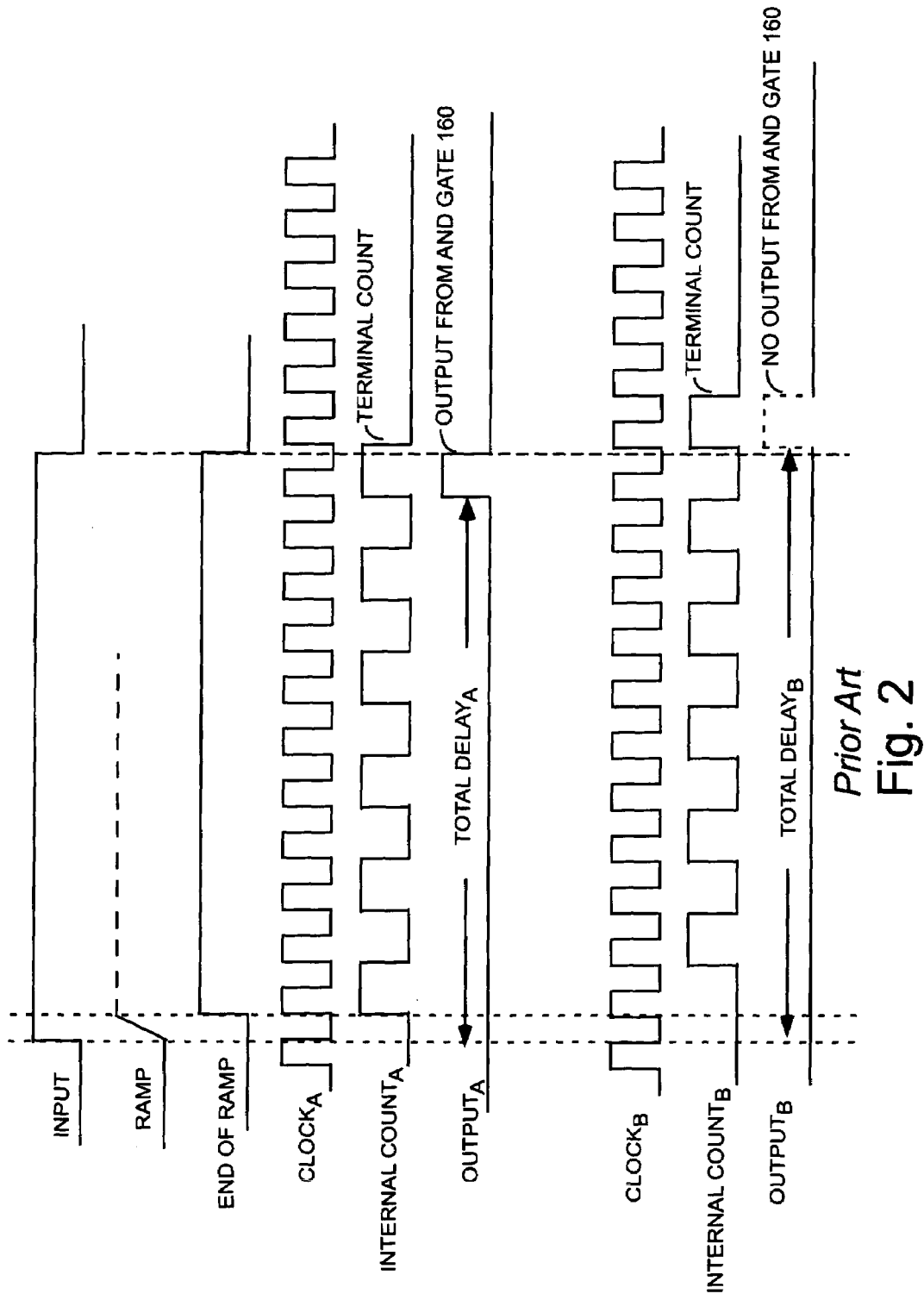
FIG. 2 depicts timing diagrams illustrating the operation of the timer circuit of FIG. 1.

FIG. 2 is an illustration of timing diagrams illustrating the operation of the timer circuit 100 of FIG. 1. Referring to FIG. 2, the timing diagrams of an input signal, a ramp signal, and an End of Ramp signal, are explained in relation to first and second sets of three waveforms representing two distinct cases, first, when the End of Ramp signal occurs just ahead of the rising edge of the clock (i.e., those signals identified by the subscript A), and second, when the End of Ramp signal occurs just after the rising edge of the clock (i.e., those signals identified by the subscript B). Each of the sets of three waveforms includes a counter clock signal, an internal counter signal and a Terminal Count output signal.

In the first case, the leading edge of the input signal starts the ramp. When the ramp reaches a predetermined amplitude level, comparator 140 switches to a high logic level state, thus generating the End of Ramp signal. The End of Ramp signal remains in the high logic level state so long as the input signal; is present. The End of Ramp signal enables counter 150 to begin counting on the next rising edge of $CLOCK_A$. Assume, for purposes of this discussion, that Counter 150 is controlled by Counter Control unit 155 to count a time interval equal to 7 clock periods. That is, the user is looking for an input signal having a pulse width greater the sum of the ramp time plus 8 rising clock edge counts of counter 150. If that condition is true, then a trigger signal ($OUTPUT_A$) will be produced at the output terminal of AND-gate 160.

In the second case, once again the leading edge of the input signal starts the ramp. When the ramp reaches a predetermined amplitude level, comparator 140 switches to a high logic level state, thus generating the End of Ramp signal. The End of Ramp signal remains in the high logic level state so long as the input signal; is present. The End of Ramp signal enables counter 150 to begin counting on the next rising edge of $CLOCK_B$. Assume for purposes of this discussion also that counter 150 is controlled by counter control unit 155 to count a time interval equal to 7 clock periods. That is, the user is still looking for an input signal having a pulse width greater the sum of the ramp time plus 8 rising clock edges of counter 150. However, in the second case, the input signal occurred later in time with respect to CLOCKB, thus causing the End of Ramp signal to just miss a rising edge of CLOCKB. Therefore Counter 150 must wait until the next rising edge of CLOCKB to begin counting. Because counter 150 still counts 8 rising clock edges before producing an output signal, the total delay between the rising edge of the input signal and the rising edge of the Terminal Count of counter 150 will be increased by an amount up to a full clock period. As shown in FIG. 2, even though the input signal is of identical length in the first and second cases, no trigger signal ($OUTPUT_B$) has been produced at the output terminal of AND-gate 160 because the Terminal Count of counter 150 missed its "window of opportunity" to be ANDED with the End of Ramp signal. It should be noted that the amount of delay provided by the ramp timer would be the same in either case, and its actual amount does not change the variability of the total timer delay. As explained above, this variability is due substantially entirely to the length of Counter clock period and the asynchronous relationship between the input signal and Counter clock.

Figure 3:
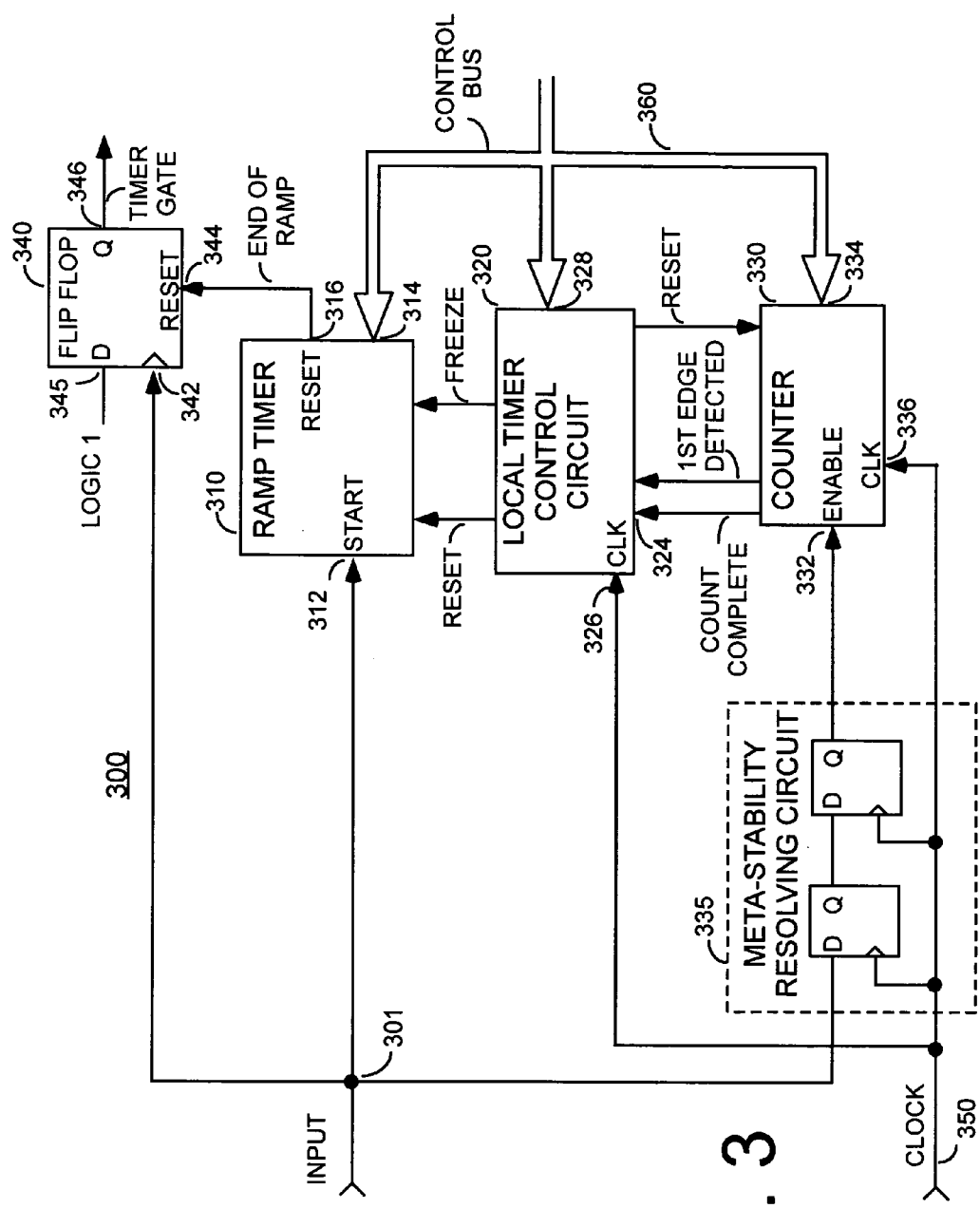
FIG. 3 is a high level block diagram of an embodiment of a timer circuit in accordance with the present invention.

FIG. 3 is a high level block diagram of an embodiment of an improved timer circuit in accordance with the present invention. The timer circuit 300 of FIG. 3 comprises an analog timer (illustratively a ramp timer) 310, a local timer control circuit 320, a counter 330, a metastability resolving circuit 335, a timer latch (illustratively a D flip flop) 340, a clock signal input path 350 and a control bus 360.

Ramp timer 310 illustratively comprises a first input 312 for receiving an input or ramp start signal, a second input 314 for receiving a ramp timing control signal, and an output 316 for providing an End of Ramp signal (Timer Done). The End of Ramp signal of ramp timer 310 is applied to an input of Timer Latch 340. Control bus 360 provides, via the second input 314 of ramp timer 310, the ramp timing control signal required to set the timing interval of the ramp timer 310. Ramp timer 310 is further adapted to receive freeze (pause) and reset (resume) signals from local timer control circuit 320 described further in detail below.

Counter 330 of FIG. 3 has a first input (ENABLE) 332 for receiving an input or counter start signal, a second input 334 for receiving a counter timing control signal from control bus 360, and a third input 336 for receiving a timing clock signal from clock signal input path 350. The output of Counter 330 provides a Terminal Count signal ("Tcount" or "Count Complete") to logic timer controller 320 when a predetermined number of clock cycles have been counted. The number of clock cycles to be counted may be entered by a user by the act of setting a timer interval for determining the pulsewidth of an input signal. Counter 330 also receives a reset signal from local timer control circuit 320. Counter 330 provides a "first clock edge detected" signal to Counter Controller 320 for upon the detection of a first clock edge following receipt of the ENABLE signal. Counter 330 of the present invention may comprise substantially any counter known in the art capable of being set to count a previously-entered number of clock periods, and may be a CMOS counter circuit.

D flip flop 340 has a first input 342 for receiving the input or start signal, a second input 344 for receiving the End of Ramp signal from ramp timer 310, and a third input 345, the flip flop's data input, which is tied to a source of a high logic level.

Control bus 360 conveys the desired user-selected count value to Counter 330 in order to set the interval of the ramp timer 310. It also conveys control information to the local timer control circuit 320 such as when to reset the timer and when only Ramp Timer 310 will be utilized to create a time interval (i.e., for short time intervals).

The local timer control circuit 320 of the timer circuit 300 has a first input 324 for receiving a terminal count signal ("Tcount" or "Count Complete") from Counter 330, a second input 326 for receiving a clock signal from clock circuit 350, a third input 328 for receiving control information from control bus 360, and a fourth input for receiving the aforementioned "First Clock Edge Detected" signal from Counter 330. As previously described, the local timer control circuit 320 transmits a freeze (pause) and unfreeze (resume ramping) signal to Ramp Timer 310 and transmits a reset signal to Counter 330.

Local timer control circuit 320 controls the ON-OFF operation of a controllable current conducting device in the ramp timer and keeps the device in a given operating state over a readily adjustable time interval. An example of such a timer control circuit is described in U.S. Pat. No. 4,107,553 issued Aug. 15, 1978 to Robert A. Carter entitled "Timer control circuit", which is incorporated herein by reference in its entirety. It should be noted that local timer control circuit 320 performs functions not performed by prior art local control timers as will be discussed in detail below.

Figure 4:
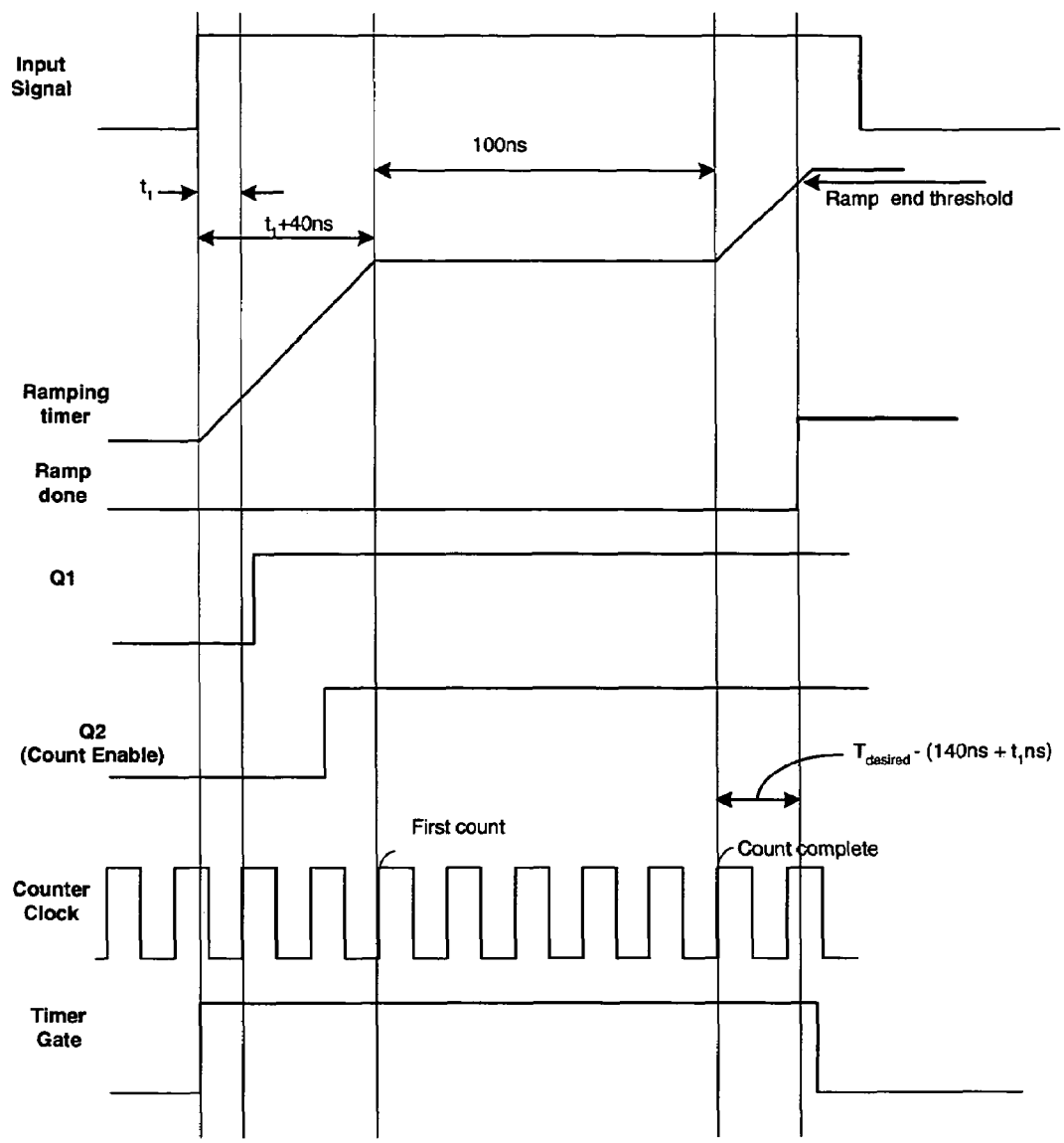
FIG. 4 depicts timing diagrams illustrating the operation of a timer circuit in accordance with an embodiment of the present invention.

The operation of a timer circuit in accordance with the present invention, such as the timer circuit 300 of FIG. 3, may be best understood with reference to the timing diagrams of FIG. 4. In the timer circuit 300 of FIG. 3, the occurrence of an input signal enables Ramp Timer 310, and enables Counter 330 through a Meta-stability circuit 335, and sets Timer Latch 340. The ramping signal of Ramp Timer 310 increases during a period, $t_1$, until the detection of the first clock edge by Counter 330 as illustrated in FIG. 4. Upon the detection of the first clock edge by counter 330, the local timer controller 320 freezes the ramping signal of Ramp Timer 310. Thereafter, a clock signal from the clock path 350 can increment Counter 330, on each occurrence of a predetermined clock edge.

More specifically, at the instant when Local Timer Controller 320 receives a First Clock Edge Detected signal, Local Timer Controller 320 transmits a signal to Ramp Timer 310 to suspend (i.e. freeze, or pause) the ramping of the ramp signal. The ramping signal of Ramp Timer 310 is maintained at a constant level (i.e., the level it exhibits when the first clock pulse is detected).

Counter 330 continues to count clock pulses while the ramping signal of Ramp Timer 310 is maintained at its constant level. When Counter 330 achieves its terminal count (i.e., when a predetermined number of clock cycles has been counted), Local Timer Controller 320 unfreezes the ramping signal of Ramp Timer 310 causing it to run for the remainder of its predetermined time interval. More specifically, when Local Timer Controller 320 receives the Terminal Count signal from Counter 330 indicating that Counter 330 has achieved its terminal count, Local Timer Controller 320 transmits a signal to Ramp Timer 310 to cause the ramp signal of Ramp Timer 310 to resume ramping; the ramp signal resuming from the level where it had been previously suspended.

The completion of the ramping interval of the ramping signal of Ramp Timer 310 causes Timer Latch 340 to reset, thus ending the timer interval.

By way of illustration in FIG. 4, the output signal of Ramp Timer 310 of FIG. 3 is shown as a ramping signal. Assume, for purposes of this explanation, a counter clock period of 20 ns, a desired total time interval of 176 ns and a delay $t_1$ ns from the start of the input signal to the occurrence next clock edge. The maximum value that $t_1$ could be is just under one clock period, 20 ns in this example. Meta-stability Resolving circuit 335 will delay the input signal from enabling the counter 330 by two clock periods. Thus, the largest interval of time from the occurrence of the input signal until Counter 330 can begin counting is three clock periods. The period of time over which Counter 330 counts must therefore be less than the desired interval reduced by three clock periods. Because Counter 330 counts only in integer multiples of the clock period, Counter 330 will be set to count the largest number of full clock periods in an interval that does not exceed the desired time interval reduced by three clock periods. In the case shown in FIG. 4, Counter 330 would be set to count (176—(3×20))/20=5 clock periods. Thus, the ramping signal of Ramp Timer 310 is set to an interval greater than 3 clock periods, that is greater than 60 ns, to be guaranteed to absorb a clock period of uncertainty associated with the delay $t_1$ from the start of the input signal to the next rising clock edge as well as two clock periods due to the delay of Meta-stability Resolving Circuit 335. The ramping signal of Ramp Timer 310 would thus be set for the remaining 76 ns (176 ns−(5×20 ns)). Meta-stability Resolving Circuit 335 is provided to ensure proper operation of Timer Circuit 330. Without Meta-stability Resolving Circuit 335, the input signal could arrive at the input of Counter 330 just as the clock is changing state, thus possibly causing Counter 330 to miscount. In fact, depending upon the internal design of Counter 330, such a "race condition" could cause the counting of a completely wrong value. Meta-stability Resolving Circuit 335 guarantees that the input signal will arrive at the input of Counter 330 at a time that ensures proper operation of Counter 330.

The waveforms of FIG. 4 show the generation of a Timer Gate signal in response to the first edge of an input signal, and having a duration determined by the interaction of Ramp Timer 310 and Counter 330. This Timer Gate signal exhibits a much more accurate width than was available by use of prior art timer circuits.

Although in the embodiment of FIG. 4 presented above, both Ramp Timer 310 and Counter 330 were used to produce a time interval, in alternate embodiments of the present invention, when short time intervals are desired, Counter 330 of Timer Circuit 300 of FIG. 3, may be disabled and the only the ramp circuit used. Likewise, if only very long time intervals are desired the ramp circuit may be disabled and only Counter 330 is used.

Timer Circuit 300 of the present invention is suited for any general timer circuit application, but is particularly well suited for pulse width discrimination. In this regard it should be noted that Timer Circuit 300 has the ability to quickly reset, to provide a wide range of substantially accurate time intervals starting at a few nanoseconds, and to resolve time intervals on the order of 500 picoseconds at faster time settings.

Figure 5:
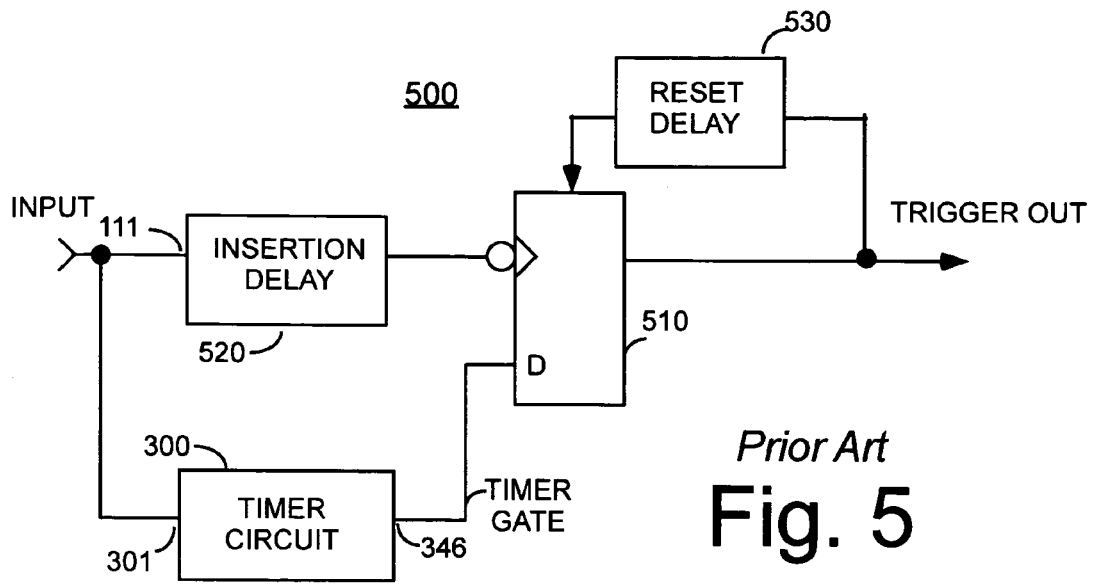
FIGS. 5 and 5a are high-level block diagrams of a trigger circuits similar in arrangement to prior art trigger circuits, but employing the Timer Circuit of FIG. 1.
Figure 5A:
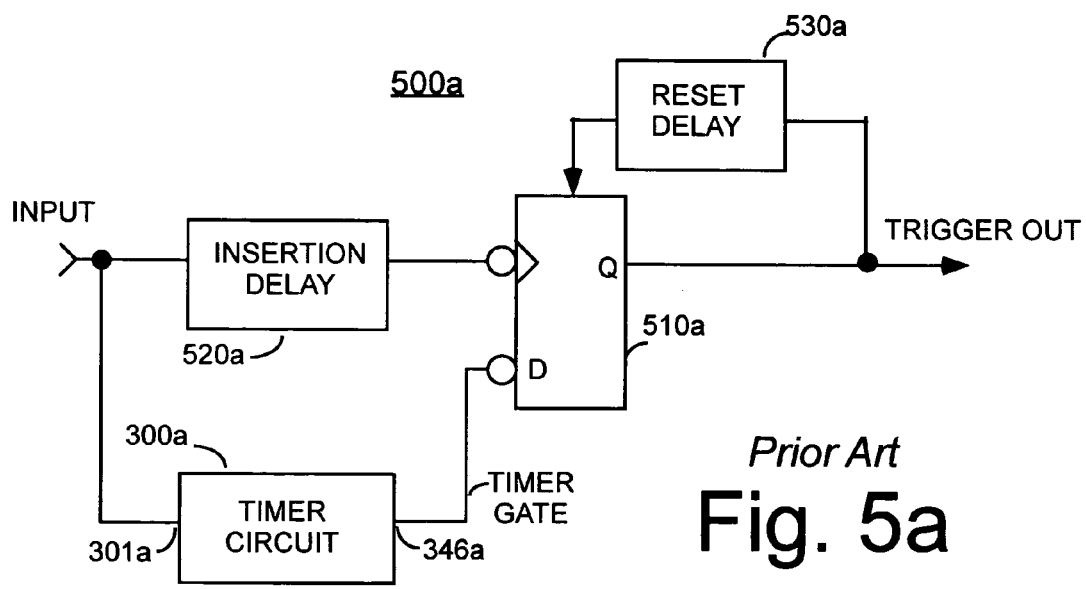

A timer circuit in accordance with the present invention may be implemented in a glitch trigger circuit for discriminating pulses less than a user-selected predetermined time interval. A glitch trigger circuit output provides a trigger output signal if an input signal is detected having a pulse width less than the predetermined time interval. FIGS. 5 and 5a are high-level block diagrams of glitch trigger circuits similar to glitch trigger circuits known from U.S. Pat. No. 5,124,587 (Stuebing, et al.). FIGS. 5 and 5a differ from the prior art in that they include a timer circuit in accordance with an embodiment of the present invention. The Glitch Trigger Circuit 500 of FIG. 5 includes Timer Circuit 300 of the present invention, an Insertion Delay Circuit 520, a Reset Delay Circuit 530 and a D-type flip-flop 510. Flip-flop 510 has a first inverted clock input for receiving the input signal and a second D input for receiving the output signal of the Timer Circuit 300. The Q output of Flip-flop 510 provides a Trigger Out signal. The function and composition of Insertion Delay Circuit 520 and the Reset Delay Circuit 530 are well known in the art and need not be described in detail herein.

In Glitch Trigger Circuit 500 of FIG. 5, the rising edge of an input signal starts Timer Circuit 300 as described above. The falling edge of the input signal is the end of the pulse, which may or may not occur before the selected time interval has expired. Note that Flip-flop 510 is clocked by a delayed falling edge of the input signal because its clock input is inverted. Thus, if the time interval of Timer Circuit 300 expires before the end of the input signal, the timer circuit output is reset to a logic low and is applied to the D input of Flip-flop 510. In this case, the logic low from the timer circuit output is clocked to the TRIGGER OUT of Flip-flop 510, and no Trigger Out signal is produced. However, if an input pulse has a duration less than the selected time interval of Timer Circuit 300, the timer circuit output signal remains in the logic high state for the duration of its specified time interval, and thus a logic high signal is present on the D input of the flip-flop 510 during the falling edge of the input pulse. Thus, a logic high is clocked to the TRIGGER OUT of Flip-flop 510, which indicates that a pulse shorter than the predetermined time interval has occurred.

Figure 7:
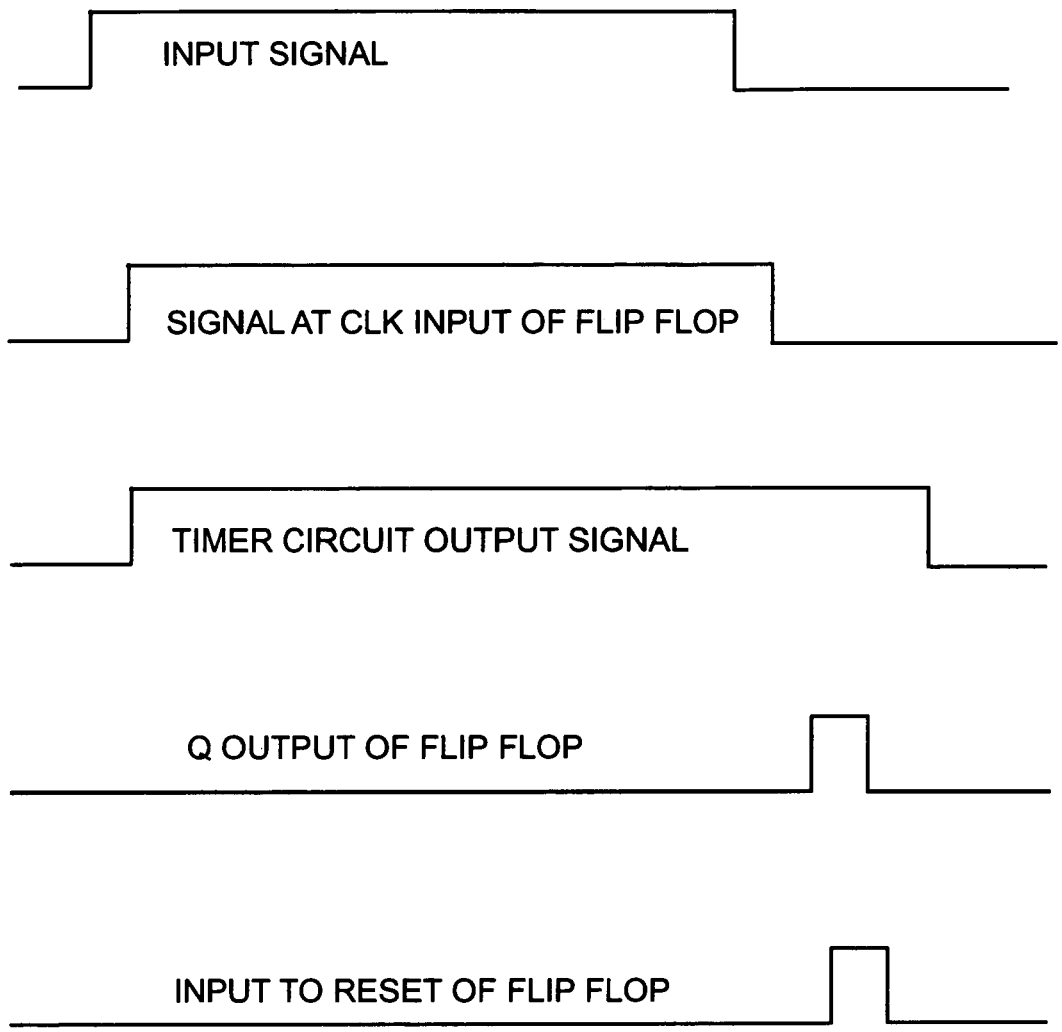
FIG. 7 depicts a timing diagram illustrating the operation of the glitch trigger circuit of FIG. 5.

FIG. 7 is a timing diagram useful for understanding the operation of Glitch Trigger circuit 500 of FIG. 5 for the case in which a glitch input signal (i.e., an input pulse shorter than the time interval of the timer circuit) is applied to the Input terminal. In FIG. 7, an input pulse is delayed by Insertion Delay Circuit 520 and coupled to the clock input of Flip-flop 510. Insertion Delay Circuit 520 adds a delay to the input signal such that the output signal of Timer Circuit 300 and the delayed input pulse are coupled to their respective inputs of Flip-flop 510 at substantially the same time. It should be noted from FIG. 7, that the input pulse ends (falls) before the expiration of the timer circuit output signal which is applied to the D input of Flip-flop 510. Therefore, the Q output of Flip-flop 510 assumes a logic high level because Flip-flop 510 is clocked by the falling edge of the delayed input signal. This logic high level output of Flip-flop 510 is a Trigger Out signal indicating the detection of a glitch input pulse by Glitch Trigger Circuit 500. The flip-flop 510 is then reset by a signal from the reset delay circuit 530.

A timer circuit in accordance with an embodiment of the present invention may be implemented in a glitch filter for discriminating pulses greater than a predetermined time interval determined by the timer circuit. A glitch filter circuit provides a Trigger Out signal if an input signal is detected having a pulse width greater than the predetermined time interval. Glitch Filter 500a of FIG. 5a comprises substantially the same arrangement as the glitch trigger circuit 500 of FIG. 5 above with the exception that the D input of Flip-flop 510a is inverted. If the input pulse width is greater than the selected timer interval, the timer circuit output signal will be a logic level low. The inverted signal at the D input is clocked as a logic level high to the output of Flip-flop 510a. Conversely, a short input pulse provides a logic high-level signal at the output of Timer Circuit 300a at the falling edge of the input signal, which is then clocked as a logic low-level signal to the output of Flip-flop 510a, and no Trigger Out signal is produced.

A timer circuit in accordance with yet another embodiment of the present invention is used to produce a trigger hold-off time interval. In currently available trigger circuits, after a trigger is detected additional trigger events are ignored for a period of time. In some cases the circuitry of a measurement device, such as an oscilloscope, requires such a hold-off time interval while it processes a first trigger event. In other cases a trigger hold-off time is used to allow a user of a measurement device, such as an oscilloscope, to direct the trigger logic to ignore certain trigger events. In some prior art circuits, trigger hold-off timer circuits built from analog timer circuits may produce signals exhibiting jitter when long hold-off times are selected. In other prior art circuits, the use of hold-off timers built using digital counters, results in timing inaccuracies of up to one clock cycle.

Figure 6:
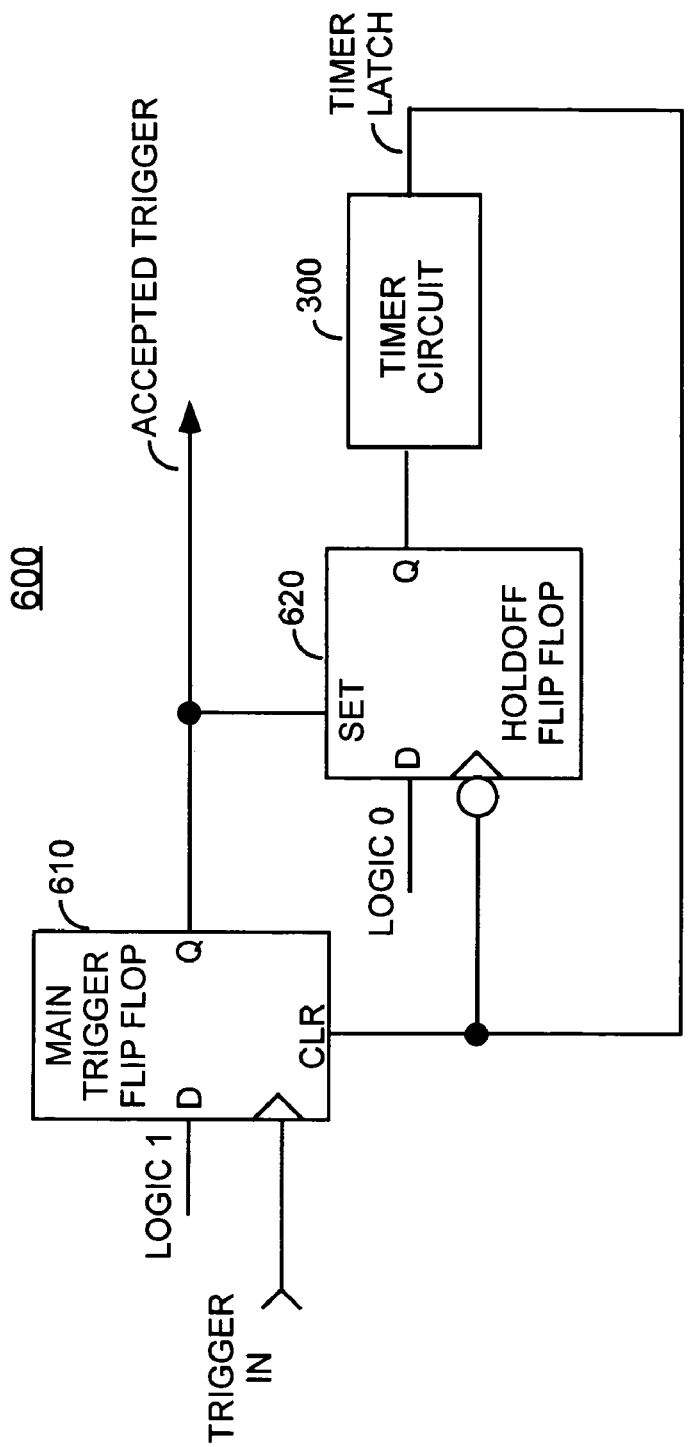
FIG. 6 is a high level block diagram of a hold-off timer circuit in accordance with the present invention.

A timer circuit in accordance with an embodiment of the present invention is used to produce a trigger hold-off time comprising both long and short time intervals with less than one clock cycle of jitter on short hold-off time intervals and with substantially less analog timer jitter on long hold-off time intervals. FIG. 6 is a high-level block diagram of a hold-off timer circuit including a timer circuit in accordance with an embodiment of the present invention. The hold-off timer circuit 600 of FIG. 6 includes a Timer Circuit 300, a Main Trigger Flip-flop 610, illustratively a first D-type flip-flop, and a Hold-off Flip flop 620, illustratively a second D-type flip-flop.

Referring to FIG. 6, initialization circuitry (not shown), causes the Q outputs of both flip-flops 610 and 620 to be placed in the Low logic level state at which point Timer Circuit 300 is not active. Trigger conditioning circuitry (not shown) recognizes trigger events and for each trigger event the trigger conditioning circuitry produces a "Trigger In" signal. A rising edge of the "Trigger In" signal causes Main Trigger Flip-flop 610 to go to a High logic level state, asserting an "Accepted Trigger" signal. The "Accepted Trigger" signal may be used by the oscilloscope as the trigger event if other conditions are satisfied, such as sufficient pre-trigger time having been elapsed. The "Accepted Trigger" signal also sets Hold-off Flip-flop 620 which asserts an input signal to Timer Circuit 300. When the input signal to Timer Circuit 300 goes high, Timer Circuit 300 asserts a "Timer Latch" signal for a time determined by the values programmed into Timer Circuit 300. The "Timer latch" signal is applied to Main Trigger Flip-flop 610 and causes the Q-output of this flip-flop to be held in the low logic level state (i.e. reset) for the duration of the time interval programmed into Timer Circuit 300. By holding Main Trigger Flip-flop 610 in the reset state, Main Trigger Flip-flop 610 is not able to recognize additional trigger events for the duration of a predetermined hold-off period. At the end of the hold-off period the "Timer latch" signal goes to a low logic level. This clocks Hold-off Flip-flop 620 to a logic low state at the input to Timer Circuit 300, allowing the Timer Circuit 300 to reset.

While Timer Circuit 300 of the hold-off timer circuit 600 of FIG. 6 is illustratively described as causing Main Trigger Flip-flop 610 to be held in a low state for the duration of the time interval programmed into the Timer Circuit 300, in alternate embodiments of the present invention, a timer circuit of the present invention may cause a Main Trigger flip-flop of a hold-off timer circuit in accordance with an embodiment of the present invention to be held in a high state for a predetermined time interval. In either case, further triggers are ignored until the predetermined time interval has expired.

While the foregoing is directed to preferred embodiments of the present invention, other and further embodiments of the invention may be devised without departing from the basic scope thereof, and the scope of the invention is determined by the claims that follow.

What is claimed is:

1. A method of producing a timing signal having a predetermined time interval, comprising the steps of:

initiating a ramping timing signal having a predetermined duration and setting a timer latch output signal substantially simultaneously in response to an occurrence of an input signal;

enabling counting of a predetermined number of clock signals in response to said occurrence of said input signal;

pausing said ramping timing signal at a present value upon an occurrence of a first clock cycle following said enabling of counting;

restarting said ramping timing signal when said predetermined number of clock cycles has occurred; and resetting said timer latch output signal upon an expiration of a predetermined duration of said ramping timing signal;

wherein said timer latch output signal is said timing signal.

2. The method of claim 1, wherein said predetermined time interval is substantially equal to the sum of said predetermined duration of said ramping timing signal and a time interval encompassing said predetermined number of clock cycles.

3. The method of claim 2, wherein said step of enabling counting includes the step of resolving a meta-stability condition by clocking said input signal with said clock signal.

4. A timer circuit, comprising:
a ramp timer responsive to an input signal for generating a ramp signal and providing an end of ramp signal at an output when said ramp signal attains a predetermined amplitude;
a counter responsive to a clock signal for counting a predetermined number of clock cycles, said input signal causing an enabling of said counter to count said cycles of said clock signal;
a timer control circuit for pausing said ramp signal of said ramp timer upon an occurrence of a first clock cycle following said enabling of said counter, and for restarting said ramp signal upon an occurrence of a last one of said predetermined number of clock cycles counted by said counter; and
a timer latch circuit for providing an output timing signal, wherein said output timing signal of said timer latch is set by said input signal and reset by said end of ramp signal.

5. The timer circuit of claim 4, wherein said ramp timer comprises:
a first input for receiving said input signal;
a second input for receiving a ramp timing control signal; and
an output for providing said end of ramp signal;
wherein said ramp timer is further adapted to receive a pause signal and a restart signal from said timer control circuit.

6. The timer circuit of claim 4, wherein said counter comprises:
a first input for receiving an enable signal;
a second input for receiving a counter timing control signal;
a third input for receiving a clock signal; and
an output for providing a terminal count signal to said timer control circuit.

7. The timer circuit of claim 4, wherein said timer latch comprises:
a first input for receiving an input signal;
a second input for receiving the end of ramp signal from said ramp timer; and
an output for providing an output timing signal, wherein said timer latch circuit comprises a D flip flop.

8. The timer circuit of claim 4, wherein said ramp timer comprises:
a ramp generator circuit for providing said ramp signal;
a comparator for providing said end of ramp signal; and
a seftable reference voltage source.

9. The timer circuit of claim 4, further including a meta-stability resolving circuit interposed between said input and said counter for receiving said input signal, clocking said input signal with said clock signal, and applying said clocked input signal to said counter to enable said counter to count.

10. The timer circuit of claim 9, wherein said meta-stability circuit comprises a pair of series connected D flip flop circuits for applying said input signal to said counter in response to said clock signal.

11. A timer circuit comprising:
means for generating a ramp timing signal, said ramp timing signal being initiated upon an occurrence of an input signal;
means for counting a predetermined number of clock cycles, said occurrence of said input signal causing an enabling of said means for counting;
means for pausing said ramp timing signal upon the occurrence of a first clock cycle following said enabling of said means for counting, and for restarting said ramp timing signal upon an occurrence of a last one of said predetermined number of clock cycles counted by said means for counting;
means for generating a signal denoting an end of ramp timing signal; and
means for receiving said input signal and said end of ramp timing signal and providing an output timing signal in response thereto.

12. A glitch trigger circuit, comprising:
a timer circuit, comprising;
a ramp timer responsive to an input signal for generating a ramp signal and providing an end of ramp signal at an output;
a counter responsive to a clock signal for counting a predetermined number of clock cycles, said input signal causing an enabling of said counter;
a timer control circuit for pausing said ramp signal of said ramp timer upon the occurrence of a first clock cycle following said enabling of said counter, and for restarting said ramp signal from a level attained when said ramp signal was paused upon an occurrence of a last one of said predetermined number of clock cycles counted by said counter; and
a timer latch circuit for providing an output timing signal having a predetermined duration; and
a D flip-flop circuit responsive to said output timing signal for providing a trigger output signal if said input signal exhibits a pulse width less than said duration of said output timing signal.

13. The glitch trigger circuit of claim 12, wherein said timer circuit further includes a meta-stability resolving circuit interposed between said input and said counter for receiving said input signal, clocking said input signal with said clock signal, and applying said clocked input signal to said counter to enable said counter to count.

14. The glitch trigger circuit of claim 13, wherein said meta-stability circuit comprises a pair of series connected D flip flop circuits for applying said input signal to said counter in response to said clock signal.

15. A glitch trigger filter, comprising:
a timer circuit, comprising:
a ramp timer for generating a ramp signal and providing an end of ramp signal at an output;
a counter responsive to a clock signal for counting a predetermined number of clock cycles, said input signal causing an enabling of said counter;
a timer control circuit for pausing said ramp signal of said ramp timer upon the occurrence of a first clock cycle following said enabling of said counter, and for restarting the ramp signal upon an occurrence of a last one of said predetermined number of clock cycles counted by said counter; and
a timer latch for providing an output timing signal; and
a D flip-flop circuit responsive to said output timing signal for providing a trigger output signal if said input signal exhibits a pulse width greater than said duration of said output timing signal.

16. The glitch trigger filter of claim 15, wherein said timer circuit further includes a meta-stability resolving circuit interposed between said input and said counter for receiving said input signal, clocking said input signal with said clock signal, and applying said clocked input signal to said counter to enable said counter to count.

17. The glitch trigger filter of claim 16, wherein said meta-stability circuit comprises a pair of series connected D flip flop circuits for applying said input signal to said counter in response to said clock signal.

18. A trigger hold-off timer circuit, comprising:
   a timer circuit, comprising:
      a ramp timer for generating a ramp signal and for providing an end of ramp signal at an output;
      a counter responsive to a clock signal for counting a predetermined number of clock cycles, said input signal causing an enabling of said counter;
      a timer control circuit for pausing the ramp signal of said ramp timer upon the occurrence of a first clock cycle following said enabling of said counter, and for restarting said ramp signal upon an occurrence of a last one of said predetermined number of clock cycles counted by said counter; and
      a timer latch circuit for providing a hold-off output signal to a first flip-flop circuit for maintaining a logic level of said first flip-flop for a predetermined time interval;
   said first flip-flop circuit asserting an Accepted Trigger signal; and
   a second flip-flop circuit for producing an output signal in response to said Accepted Trigger signal to provide a control input to said timer circuit.

19. The trigger hold-off timer circuit of claim 18, wherein said hold-off output signal produced by said timer latch is applied to said first flip-flop circuit to maintain said first flip-flop circuit at a logic low level for said duration of said predetermined time interval.

20. The trigger hold-off timer circuit of claim 18, wherein said first flip-flop and said second flip-flop comprise D flip-flops.

21. The trigger holdoff timer circuit of claim 18, wherein said timer circuit further includes a meta-stability resolving circuit interposed between said input and said counter for receiving said input signal, clocking said input signal with said clock signal, and applying said clocked input signal to said counter to enable said counter to count.

22. The trigger holdoff timer circuit of claim 21, wherein said meta-stability circuit comprises a pair of series connected D flip flop circuits for applying said input signal to said counter in response to said clock signal.

23. A timer circuit, comprising:
   a ramp timer responsive to an input signal for generating a ramp signal and providing an end of ramp signal;
   a counter responsive to a clock signal for counting a predetermined number of clock cycles, said input signal causing an enabling of said counter;
   a timer control circuit for pausing the ramp signal of said continuous timer at a level upon the occurrence of a first clock cycle following said enabling of said counter, and for restarting the ramp signal from said level upon an occurrence of a last one of said predetermined number of clock cycles counted by said counter; and
   a logic gate for combining said input signal and said end of ramp signal for providing an output timing signal.

24. The timer circuit of claim 23, wherein said logic gate comprises an AND logic gate.

25. The timer circuit of claim 24, wherein said timer circuit further includes a meta-stability resolving circuit interposed between said input and said counter for receiving said input signal, clocking said input signal with said clock signal, and applying said clocked input signal to said counter to enable said counter to count.

26. The timer circuit of claim 25, wherein said meta-stability circuit comprises a pair of series connected D flip flop circuits for applying said input signal to said counter in response to said clock signal.

* * * * *